United States Patent [19]

Ohta

[11] Patent Number: 5,361,007
[45] Date of Patent: Nov. 1, 1994

[54] APPARATUS FOR CONTROLLING CONSUMPTION POWER FOR GAAS FET

[75] Inventor: Kiyoshi Ohta, Tokyo, Japan

[73] Assignee: NEC Corporation, Tokyo, Japan

[21] Appl. No.: 937,341

[22] Filed: Aug. 31, 1992

[30] Foreign Application Priority Data

Aug. 30, 1991 [JP] Japan .................. 3-220504

[51] Int. Cl.[5] ............................... H03K 17/687
[52] U.S. Cl. ........................ 327/427; 327/543
[58] Field of Search ............. 307/571, 296.6, 296.8

[56] References Cited

U.S. PATENT DOCUMENTS

| | | | |
|---|---|---|---|
| 3,412,266 | 11/1968 | Tarico | 307/571 |
| 3,414,737 | 12/1968 | Bowers, Jr. | 307/571 X |
| 4,125,789 | 11/1978 | Van Schoiack | 307/296.8 |
| 4,158,149 | 6/1979 | Otofuji | 307/571 |
| 4,417,164 | 11/1983 | Edlund | 307/571 X |
| 5,087,898 | 2/1992 | Pyndiah et al. | 307/571 X |
| 5,258,662 | 11/1993 | Skovmand | 307/571 X |

*Primary Examiner*—Willis R. Wolfe
*Attorney, Agent, or Firm*—Sughrue, Mion, Zinn, Macpeak & Seas

[57] ABSTRACT

In a consumption power controlling apparatus for a GaAs FET amplifier, even when a consumption power is controlled, the changes respectively in the gain, the phase, and the deviation of gain within a band can be minimized in a satisfactory manner. There are disposed resistor means arranged between first power source means and a drain region of a GaAs FET and variable resistor means having an adjusting member and being arranged between output terminals respectively of the first power source means and variable voltage means. The adjusting member is connected to a gate region of the GaAs FET. There is also disposed control means having two input terminals between which the resistor means to supply a control signal to the variable voltage means so as to control a voltage developed across the resistor means to be substantially equal to a predetermined reference value, thereby obtaining a fixed drain current of the FET.

3 Claims, 4 Drawing Sheets

APPARATUS FOR CONTROLLING CONSUMPTION POWER FOR GAAS FET

BACKGROUND OF THE INVENTION

The present invention relates to an apparatus for controlling an electric power consumed by an amplifier including a GaAs field effect transistor (FET), and in particular to an apparatus for controlling an electric power consumed by an amplifier including a GaAs FET capable of minimizing a variation in gain, a variation in phase, and a deviation of gain within a band for the amplifier. Description of the Related Art In a conventional apparatus for controlling an electric power consumed by an amplifier including a GaAs FET, a positive voltage having a fixed value is continuously supplied from a power supply circuit to a drain region of the GaAs FET and a negative voltage having a variable value is delivered from a power supply to a gate region of the GaAs FET. The negative voltage fed to the gate region is controlled according to a value not less than a pinch-off voltage of the GaAs FET to alter a source-to-drain or drain current (ID), thereby controlling the power consumed by the GaAs FET.

However, in the conventional power controller of this type, the drain current is changed by varying the gate voltage of the GaAs FET to control the power consumption, which leads to considerably large changes respectively in the gain, the phase, and the deviation of gain within a band. The changes in the gain and phase cause an alteration in the quantity of improvement of distortion; moreover, the variation in the deviation minimizes a compensation bandwidth of the GaAs FET. This consequently leads to a drawback that in a linear amplifier in which a component of intermodulation distortion appearing in an amplifier including a multi-stage connection is compensated for by cancelling the distortion component with a component having an identical amplitude and an opposite phase with respect to those of the distortion component, the compensation cannot be easily achieved.

In order to improve the disadvantageous feature, there is required quite a fine and complex control in consideration of the gain and phase, which leads to a problem that the hardware configuration and software system are complicated and increased.

SUMMARY OF THE INVENTION

It is therefore an object of the present invention to provide an apparatus for controlling an electric power consumed by an amplifier including a GaAs FET capable of effectively minimizing a variation in gain, a variation in phase, and a deviation of gain within a band developed when the consumed power is controlled, thereby solving the problem above.

In accordance with the present invention, there is provided a consumption power controlling apparatus for an amplifier using a GaAs FET comprising first power source means for supplying a positive direct-current voltage to a drain region of the FET, second power source means for supplying a negative direct-current voltage to a gate region of the FET, variable voltage means connected to an output terminal of the second power source means for variably controlling an output voltage from the second power source means, resistor means having a terminal connected to an output terminal of the first source means and another terminal connected to the drain region of the FET, variable resistor means having an adjusting member, the variable resistor means having a terminal connected to the output terminal of the first source means and another terminal connected to an output terminal of the variable voltage means the drain region of the FET, the adjusting member being connected to the gate region of the FET; and control means for detecting a voltage developed across the resistor means for supplying a control voltage to the variable voltage means, thereby setting the voltage to be substantially equal to a preset reference value. The variable voltage means controls, in response to the control signal from the control means, the voltage supplied from the second power source means to the gate of the FET, thereby keeping a drain current of the FET at a constant value.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

For better understanding of the present invention, description will now be given of an apparatus for controlling an electric power consumed by a conventional amplifier using a GaAs FET.

Figure 1:
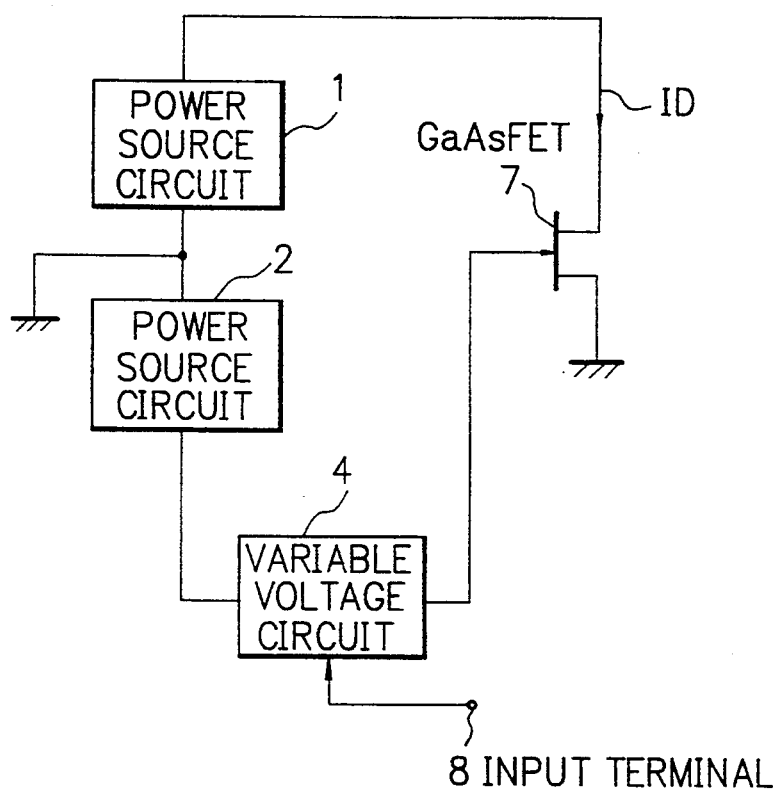
FIG. 1 is a schematic block diagram showing the configuration of an example of the consumption power controlling apparatus of the prior art.
Figure 2:
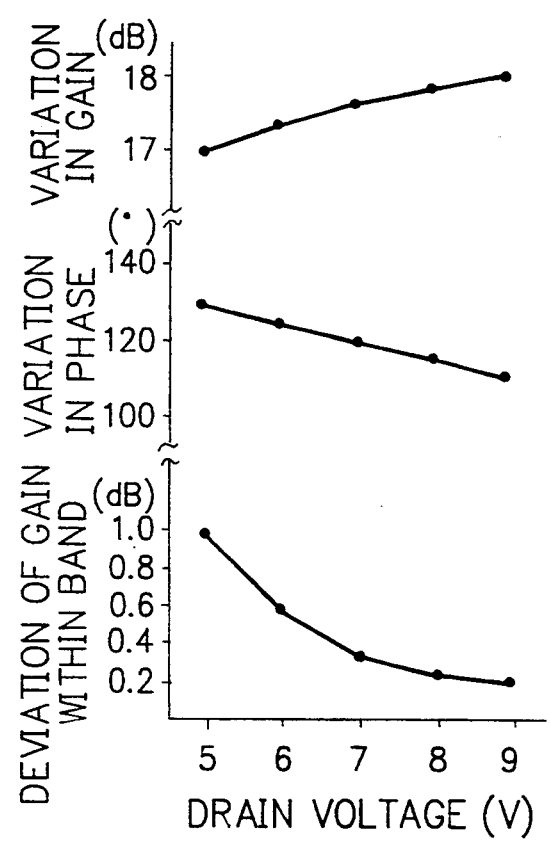
FIG. 2 is a graph showing changes respectively in the gain, the phase, and the deviation of gain within a band developed when the consumption power is controlled.

FIG. 1 shows an apparatus for controlling an electric power consumed by a conventional GaAs FET amplifier, whereas FIG. 2 shows changes respectively in the gain, the phase, and the deviation of gain within a band developed when the consumption power is controlled in the power consumption controlling apparatus of FIG. 1.

Conventionally, an apparatus for controlling an electric power consumed by a GaAs FET amplifier includes, as shown in FIG. 1, a power source circuit 1 for continuously supplying a positive voltage having a fixed value to a drain region of the GaAs FET 7, a power source circuit 2 for supplying a negative voltage, and a variable voltage circuit 4 for controlling the negative voltage produced from the power source circuit 2 to supply the controlled negative voltage to a gate region of the GaAs FET. The negative voltage fed from the variable voltage circuit 4 is controlled according to a value not less than a pinch-off voltage of the GaAs FET 7 to alter a drain current (ID), thereby controlling the electric power consumed by the GaAs FET.

However, in such a conventional power controlling apparatus, the gate voltage of the GaAs FET is controlled by a control signal supplied from an input terminal 8 to vary the drain current, thereby supervising the consumed power. Consequently, due to the power control, there appear considerably large changes respectively in the gain, the phase, and the deviation of gain within a band as shown in FIG. 2.

Figure 3:
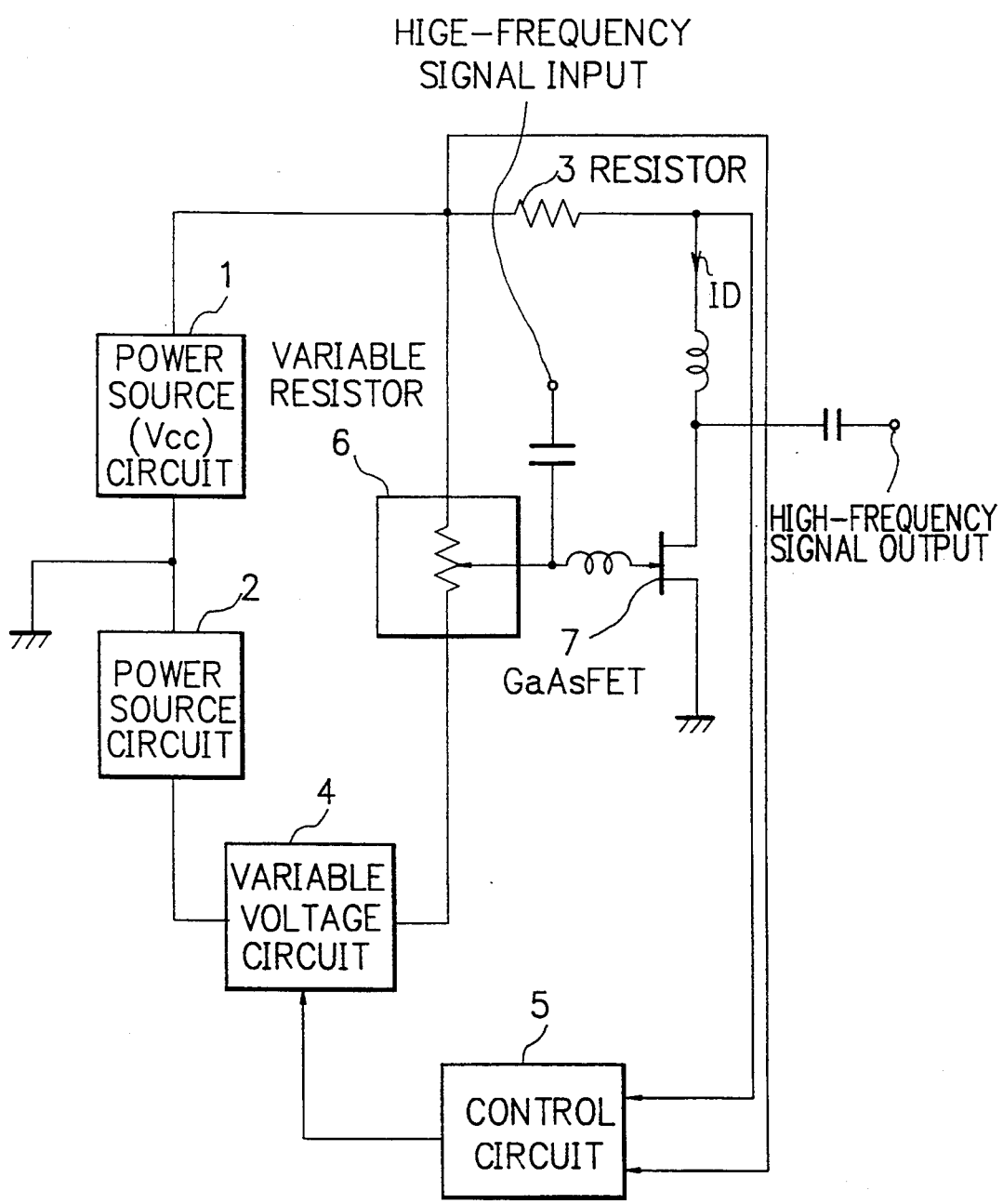
FIG. 3 is a block diagram schematically showing the constitution of an embodiment of an apparatus for controlling an electric power consumed by an amplifier including a GaAs FET in accordance with the present invention.

FIG. 3 shows the structure of the consumption power controlling apparatus in an embodiment according to the present invention.

The apparatus of FIG. 3 includes a first power source circuit 1 for producing a positive direct-current voltage, a second power source circuit 2 for producing a negative direct-current voltage, a variable voltage circuit 4 having an input connected to an output from the power source circuit 2 for controlling an output voltage from the power source circuit 2 based on a control signal received from a control circuit 5, and a GaAs FET 7 having a source region connected to a common or shared potential.

Between an output terminal of the power source circuit 1 and a drain region of the GaAs FET 7, there is arranged a resistor 3. Between an output terminal of the power source circuit 1 and an output terminal of the variable voltage circuit 4, there is disposed a variable resistor 6 having an adjusting member. The adjusting member is connected to a gate region of the GaAs FET 7. The resistor 3 is connected between two input terminals of the control circuit 5. The control circuit 5 detects a voltage developed across the resistor 3 and then compares the voltage with a predetermined reference voltage. Depending on a result of comparison, to set the detected voltage to be substantially equal to the predetermined reference value, the control circuit 5 delivers a control signal to the variable voltage circuit 4.

Figure 4:
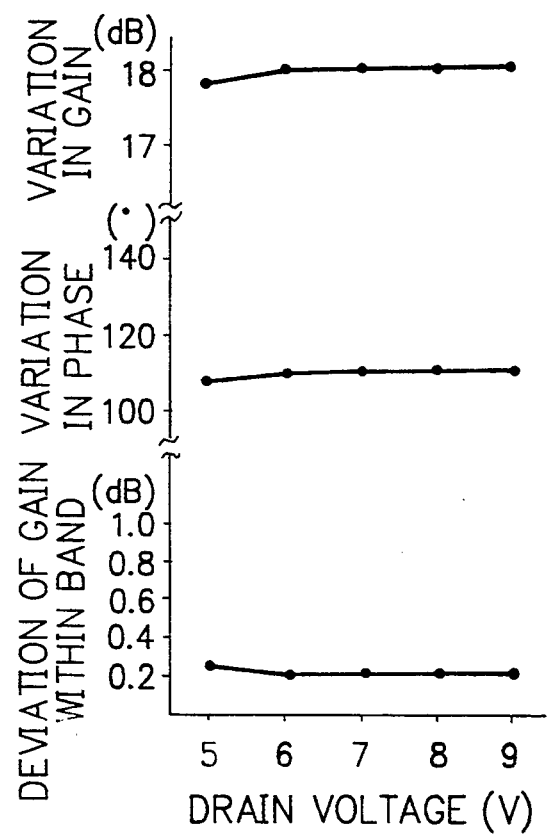
FIG. 4 is a graph showing changes respectively in the gain, the phase, and the deviation of gain within a band developed when the consumption power is controlled in the consumption power controlling apparatus of FIG. 3.

Description will now be given of the operation of the consumption power controlling apparatus thus constructed. FIG. 4 shows changes respectively in the gain, the phase, and the deviation of gain within a band developed when the consumption power is controlled in the consumption power controlling apparatus according to the present invention.

In the amplifier including a GaAs FET to be operated with a source region thereof connected to a grounding potential as shown in FIG. 3, the drain current (ID) is generally controlled as follows. First, the variable voltage circuit 4 is set to the minimum voltage and is then powered from the power source circuit 2 so as to develop the negative voltage representing a lowest value.

Next, the adjustable member of the variable resistor 6 is moved toward the side of the variable voltage circuit 4 to supply the lowest voltage to the gate region of the GaAs FET 7; thereafter, the power source circuit 1 is turned on to supply a positive voltage thereto. Thereafter, the variable resistor 6 is adjusted so as to cause a predetermined drain current (ID) to flow. For a regular drain current (ID), there appears across the resistor 3 a voltage drop which is a product (R·ID) between the resistance R of the resistor 3 and the drain current ID. Consequently, the control circuit 5 monitors the voltage drop through the resistor 3 to control the variable voltage circuit 4 so that the value of product (R·ID) is continuously kept retained at the predetermined reference value. That is, the control circuit 5 includes a comparator for comparing the value of voltage with the predetermined reference value. Depending on a result of comparison, the control circuit 5 sends a control signal to the variable voltage circuit 4, thereby controlling the quantity of voltage change in voltage to be developed by the variable voltage circuit 4.

Next, a detailed description will be given particularly of reduction of the power consumption in the consumption power control according to the present invention.

As above, the apparatus is initiated to supply the gate region of the GaAs FET with the lowest voltage to prevent a large drain current from flowing therethrough. Thereafter, the adjusting member of the variable resistor 6 is moved to lower the voltage (Vcc) to be supplied from the power source circuit 1. When the voltage is decreased, the gate voltage of the FET is also lowered and hence the drain current (ID) is minimized. This means that the voltage monitored by the control circuit 5 is reduced. The control circuit 5 compares the predetermined reference voltage with the product between the resistance R of the resistor 3 and the drain current ID to continuously achieve the control operation until there is attained a matching condition as a result of comparison, thereby completing a cycle of control operation. Until the preset consumption power is developed, the control circuit 5 conducts several cycles of control operation above.

In accordance with the present invention, there are disposed resistor means arranged between an output terminal of first power source means and a drain region of a GaAs FET and variable resistor means having an adjusting member and being arranged between output terminals respectively of the first power source means and variable voltage means, the adjusting member being connected to a gate region of the GaAs FET. Control means having two input terminals between which the resistor means is arranged supplies a control signal to the variable voltage means, thereby controlling a voltage developed across the resistor means to be substantially equal to a predetermined reference value.

In consequence, since the drain current flowing through the GaAs FET is set to be a fixed value, even when the consumption power is controlled, the changes respectively in the gain, the phase, and the deviation of gain within a band can be satisfactorily minimized.

In the embodiment, for simplification of drawing, a circuit for deleting a direct-current component from a high-frequency signal supplied to the amplifier is shown in quite a simplified form.

As above, in accordance with the present invention, there can be attained an advantageous effect that the changes respectively in the gain, the phase, and the deviation of gain within a band can be satisfactorily minimized even when the consumption power is controlled. Consequently, in a case where an amplifier to which the consumption power controlling apparatus is applied to compensate for the distortion, there need not be accomplished the fine and complex control operation, thereby contributing to minimization of the circuit.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A consumption power controlling apparatus for an amplifier using a GaAs FET comprising:
   first power source means for supplying a positive direct-current voltage to a drain region of said FET;

second power source means for supplying a negative direct-current voltage to a gate region of said FET;

variable voltage means connected to an output terminal of said second power source means for variably controlling an output voltage from said second power source means;

resistor means having a terminal connected to an output terminal of said first power source means and another terminal connected to said drain region of said FET;

variable resistor means having an adjusting member, a terminal connected to said output terminal of said first power source means, and another terminal connected to an output terminal of said variable voltage means, said adjusting member being connected to said gate region of said FET; and control means for detecting a voltage developed across said resistor means for supplying a control signal to said variable voltage means, thereby setting said voltage to be substantially equal to a preset reference value, said variable voltage means controlling, in response to said control signal from said control means, said voltage supplied from said second power source means to said gate region of said FET, thereby keeping a drain current of said FET at a constant value.

2. An apparatus as claimed in claim 1, wherein said control means includes comparing means for comparing the voltage developed across said resistor means with said preset reference value and supplying said control signal to said variable voltage means depending on a result of the comparison achieved by said comparing means.

3. An apparatus as claimed in claim 1, wherein said variable voltage means includes said variable resistor means.

* * * * *